United States Patent
McNamara

(10) Patent No.: US 8,354,835 B2
(45) Date of Patent: Jan. 15, 2013

(54) WIDE RANGE CURRENT SENSING

(75) Inventor: Robert McNamara, Mountain View, CA (US)

(73) Assignee: Apple Inc., Cupertino, CA (US)

( * ) Notice: Subject to any disclaimer, the term of this patent is extended or adjusted under 35 U.S.C. 154(b) by 312 days.

(21) Appl. No.: 12/723,367

(22) Filed: Mar. 12, 2010

(65) Prior Publication Data

US 2011/0221424 A1   Sep. 15, 2011

(51) Int. Cl.
*G01R 1/20* (2006.01)
*G01R 31/26* (2006.01)
(52) U.S. Cl. .................................. 324/126; 324/762.09
(58) Field of Classification Search .. 324/762.01–762.1, 324/754.01–754.3, 126, 127, 117 H, 117 R; 257/48; 438/14–18
See application file for complete search history.

(56) References Cited

U.S. PATENT DOCUMENTS

| | | | |
|---|---|---|---|
| 4,876,517 A | 10/1989 | Arcus | |
| 6,037,826 A * | 3/2000 | Poletto et al. | 327/375 |
| 6,624,671 B2 | 9/2003 | Fotouhi | |
| 7,615,988 B2 | 11/2009 | Blakely | |
| 7,990,119 B2 * | 8/2011 | Petty | 323/273 |

OTHER PUBLICATIONS

Linear Technology Corporation, "Adjustable 1.1A Single Resistor Low Dropout Regulator," Feb. 27, 2008, 26 pages.
Linear Technology Corporation, "Current Sense Circuit Collection," Dec. 2005, 76 pages.
Linear Technology Corporation, "300mA Micropower VLDO Linear Regulator," Oct. 31, 2008, 12 pages.
Maxim, "High-Side Current-Sense Measurement: Circuits and Principles," 13 pages, Nov. 19, 2001.
"Current Sensing Using an LT1575 Fast Linear Controller," 1 page, Jan. 2010.

* cited by examiner

*Primary Examiner* — Tung X Nguyen
(74) *Attorney, Agent, or Firm* — Lawrence J. Merkel; Tamas Korvacs; Meyertons, Hood, Kivlin, Kowert & Goetzel, P.C.

(57) ABSTRACT

A current sense circuit, including a voltage regulator, for detecting current conducted by a device under test (DUT) for a wide range of currents, while still providing fine granularity for detecting low/small currents. Two current branches/paths may be established to the supply terminal of the DUT. A switching device, e.g. a transistor device, may be operated to enable a first current branch of the two current branches, or both current branches to conduct current, responsive to the size of the current flowing in the first current branch. The total current conducted by the DUT may be equivalent to a sum of the respective currents flowing in the two current branches. When the switching device is turned off, very small currents conducted by the DUT may be measured with fine granularity. When the switching device is turned on, substantially larger currents conducted by the DUT may be measured.

22 Claims, 2 Drawing Sheets

WIDE RANGE CURRENT SENSING

BACKGROUND

1. Field of the Invention

This invention is related to the field of electrical measurements, more particularly, to current sensing.

2. Description of the Related Art

Measuring, sensing and/or controlling current flow into and out of electronic circuits is an important requirement in many electronic systems, spanning a wide range of applications. There are numerous different current sensing techniques, which are as diverse as the applications that require monitoring current flow. Examples of systems that may rely on current sensing to perform essential functions include programmable current sources, overcurrent-protection and monitoring devices, various low-current systems, battery chargers, various power supplies, and circuits where the ratio of output current to input current is of importance. In addition, portable applications may also require dedicated current monitors that fit in a small package and operate with low quiescent current.

The two most common current-measurement/current-sensing methods are low-side current sensing and high-side current sensing. In the case of low-side current sensing, the current is sensed in the ground return path of the power connection to the monitored load or device under test (DUT), and generally flows in just one direction. Any switching that is performed is on the load-side of the current sense circuit. In the case of high-side current sensing, the current is sensed in the supply path of the power connection to the monitored load (in other words, the sensing path in this case typically includes the supply terminal of the load). Current generally flows in just one direction, with switching performed on the load side of the current sense circuit.

The low-side and high-side configurations have trade-offs in different areas. For example, the low-side resistor adds undesirable extraneous resistance in the ground path, while circuitry associated with the high-side resistor has to withstand relatively large common-mode signals. Overall, advantages of low-side current sensing include low input common-mode voltage, ground referenced output voltage, and easy single supply design. Disadvantages of low-side current sensing include the load being lifted from direct ground connection. Overall, advantages of high-side current sensing include the load being grounded. Disadvantages of high-side current sensing include high input common-mode voltages, and the need to level shift the output down to system operating voltage levels.

Full-range (i.e. high and low side) current sensing configurations are also used, where a bidirectional current is sensed in a bridge driven load, or unidirectional high side connection with a supply side switch. While full-range current sensors may require only one current sense resistor for bidirectional sensing, and feature convenient sensing of load current on/off profiles for inductive loads, they're also prone to wide input common-mode voltage swings, with the common-mode rejection also limiting high frequency accuracy in PWM applications. Some applications may require current sensing over a wide range of current values, with increased resolution when measuring smaller currents. Many present solutions for sensing current over a wide dynamic range use two current sense amplifiers with two values of sense resistors and a comparator, to allow for higher sensitivity and resolution of measurement for low currents while also sensing higher currents.

SUMMARY

In one set of embodiments, a current sense circuit may be designed around a low dropout (LDO) linear voltage regulator, and may be configured to detect a current conducted by a device under test (DUT) or load for a wide dynamic range of currents, while still providing fine granularity when detecting low/small currents. Two current branches may be established in parallel to the supply terminal of the DUT. A switching device (e.g. a transistor device, such as a BJT or MOSFET) may be used to enable either only a first current branch of the two current branches, or both of the current branches to conduct current, depending on the size of the current flowing in the first current branch. In one embodiment, the switching device may operate to prevent the second current branch from conducting current, responsive to the current conducted (flowing) in the first current branch having a value below a specified current threshold. The switching device may also operate to enable the second current branch to conduct current when the current conducted in the first current branch reaches the specified current threshold.

The current sense circuit may be configured such that the total current conducted by the DUT at any time is equivalent to the sum of the respective currents conducted by the first current branch and the second current branch. Accordingly, when the switching device is turned off, the total current conducted by the DUT will be the same as the current conducted by the first current branch, and very small currents flowing in the DUT may be measured with fine granularity with an appropriately sized shunt resistor configured in the first current path. When the switching device is turned on, the current conducted in the second current branch will add to the current conducted by the first current branch to provide the total current to the DUT, and substantially larger currents flowing in the DUT may be measured with an appropriately sized shunt resistor configured in the second current path.

This provides a current sense configuration with the capability of measuring load currents within a wide dynamic range, while providing fine granularity when measuring low (e.g. under 100 mA) currents. The current sense circuit may also incorporate a voltage control circuit for directly setting the value of the voltage at the supply terminal of the DUT device by providing a feedback voltage to the voltage regulator. The voltage control circuit may include a capacitor for readjusting the phase margin and thus provide a better loop response during voltage regulation.

Current conducted by a load may therefore be sensed and/or measured by establishing a first current flowing through a first current path into a power terminal of the load, and responsive to the first current reaching a threshold value, establishing a second current flowing through a second current path into the power terminal of the load. The load would thereby conduct a total current equivalent to a sum of the currents flowing into the power terminal of the load, that is, a sum of the first current and the second current (when there is a second current flowing). The current paths may be configured such that the second current is one or more orders of magnitude higher than the first current, allowing for fine granularity in measuring lower currents (e.g. under 100 mA) when there is no current flow in the second current path, and enabling the circuit to allow for measurement of larger currents conducted by high current requirement loads.

In one set of embodiments, the current conducted by a device (with the device having a supply terminal configured to receive a supply voltage and further having a reference terminal) may be sensed by establishing a first current flowing through a first shunt element into the supply terminal of the device, and responsive to the first current reaching a threshold value, establishing a second current flowing through a second shunt element into the supply terminal of the device, with the first shunt element having a value at least one order of magnitude higher than the value of the second shunt element. The voltage across the first shunt element may then be measured to obtain the value of the first current, and the voltage across the second shunt element may be measured to obtain the value of the second current. The total current conducted by the device will be the sum of the first current and the second current. By establishing the first shunt element with a value at least one order of magnitude higher than the value of the second shunt element, and having a value suited to the expected regulated voltage at the supply terminal of the load, smaller load currents may be measured at a finer granularity.

BRIEF DESCRIPTION OF THE DRAWINGS

The following detailed description makes reference to the accompanying drawings, which are now briefly described.

Figure 1:
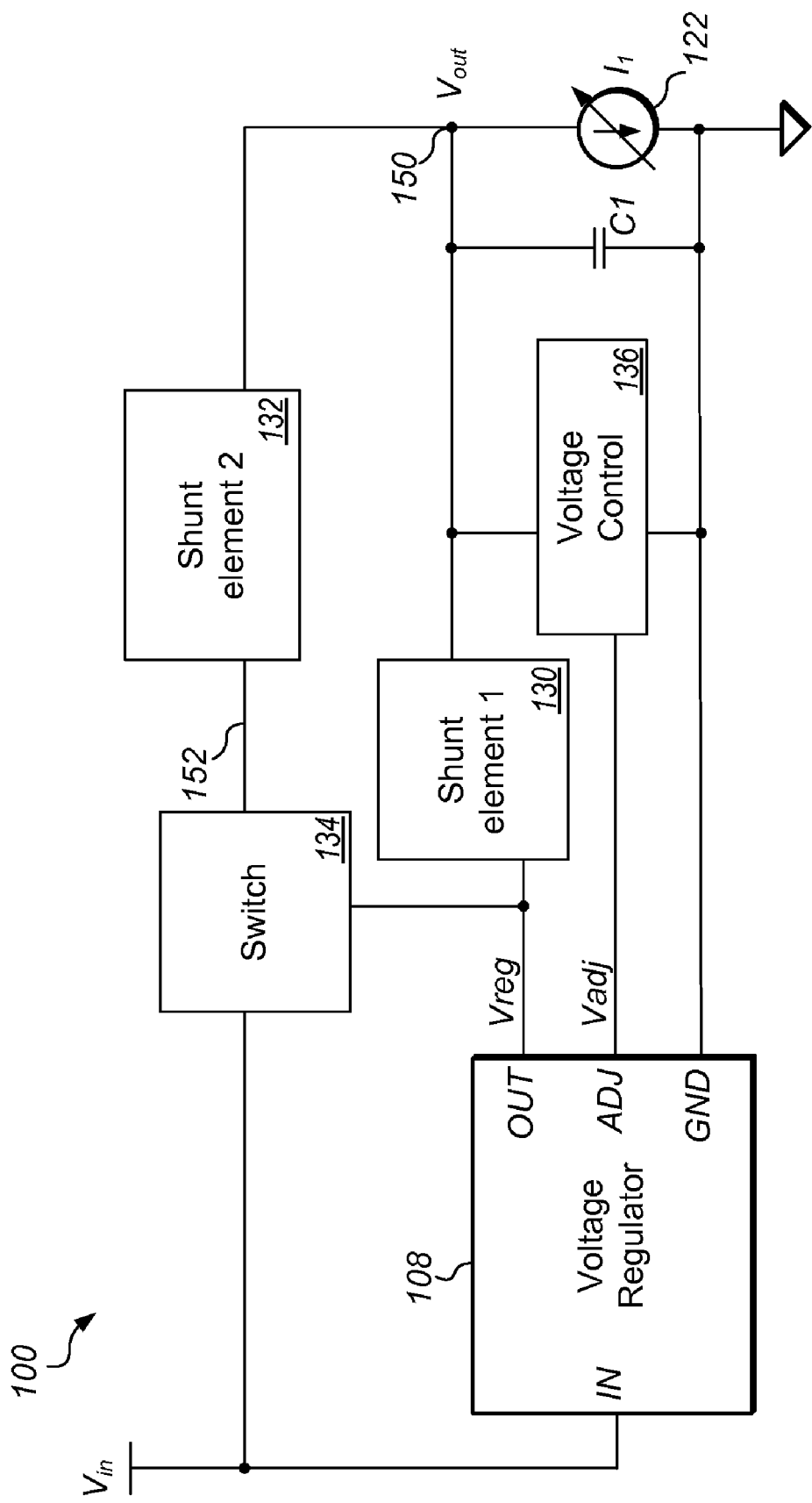
FIG. 1 is a block diagram of a current sense circuit using dual current paths with a switching element, according to various embodiments of the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits and/or memory storing program instructions executable to implement the operation. The memory can include volatile memory such as static or dynamic random access memory and/or nonvolatile memory such as optical or magnetic disk storage, flash memory, programmable read-only memories, etc. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component.

DETAILED DESCRIPTION OF EMBODIMENTS

FIG. 1 shows a current sense circuit 100 for measuring current conducted by a device under test (DUT) 122, according to one set of embodiments. While load 122 is shown as being coupled to the current sense circuit, load 122 is not functionally a part of current sense circuit 100, but is rather any device/load that may be coupled to current sense circuit 100 for the purpose of measuring the current conducted by load 122. As shown in FIG. 1, current sense circuit 100 may be built around a voltage regulator 108, which may be a linear low-dropout (LDO) voltage regulator, configured to receive an input voltage $V_{in}$ at an input terminal and provide a regulated output voltage Vreg based on $V_{in}$. As also shown in FIG. 1, a first current branch may be established from the output terminal of voltage regulator 108 through a first shunt element 130 to the supply terminal (at node 150) of the load device (or DUT) 122. A second current branch may also be established, in parallel with the first current branch, through switch 134 and second shunt element 132, to the supply terminal (at node 150) of load device 122. When load 122 is coupled as shown, switch 134 may operate to enable current flow in the second current branch responsive to the current in the first current branch exceeding a specified threshold value.

The values of shunt elements 132 and 130 may be specified/set such that the current flowing through shunt element 130 is at least one order of magnitude lower than any current that may flow through shunt element 132, when shunt element 132 is conducting current. For example, switch 134 may operate to turn on when the current flowing through shunt element 130 reaches 200 mA, which may occur when the voltage drop across shunt element 130 (i.e. Vreg–$V_{out}$) reaches a specific value. Therefore, if load 122 is a circuit/component/device that conducts low currents during normal operation, the nominal value of the regulated output voltage $V_{out}$ may be specified to be a lower voltage (e.g. 0.4V), to obtain a lower supply voltage established at node 150 to power load 122. The nominal value (i.e. the desired value) of $V_{out}$ may be set by configuring voltage control block 136. As used herein, nominal value is meant to indicate a desired value, which may in practice differ from the actual value developed at the output of voltage regulator 108 due to various factors, though it may remain within a specified, typically acceptable margin of deviation from the desired nominal value.

As mentioned above, the value of $V_{out}$ may be set using voltage control element 136. In addition, voltage control element 136 may also be configured in the feedback path from $V_{out}$ to the feedback terminal (ADJ) of voltage regulator 108, to provide the feedback signal (Vadj) to voltage regulator 108 so that voltage regulator 108 may adjust the current it sources at its output (OUT), based on Vadj. As a result, Vreg may vary with the load current in a manner such that $V_{out}$ is kept substantially constant as the load current varies. As previously mentioned, the respective values of shunt elements 130 and 132 may be specified to allow a load 122 coupled to current sense circuit 100 to conduct a relatively large current, while also enabling lower currents conducted by load 122 to be measured more accurately. For example, if shunt element 130 has a value at least one order of magnitude higher (e.g. 10×) than the value of shunt element 132, whenever shunt element 132 does conduct current, the incremental current conducted by shunt element 132 (or flowing through shunt element 132) may be exponentially higher than the incremental current conducted by shunt element 130, the actual current values determined by the actual values of Vreg and $V_{out}$ for given values of shunt elements 130 and 132. The total current conducted by load 122 would be the sum of the respective currents flowing through shunt element 130 and shunt element 132. To better illustrate this configuration, one possible embodiment of current sense circuit 100 is shown in more detail in FIG. 2.

Figure 2:
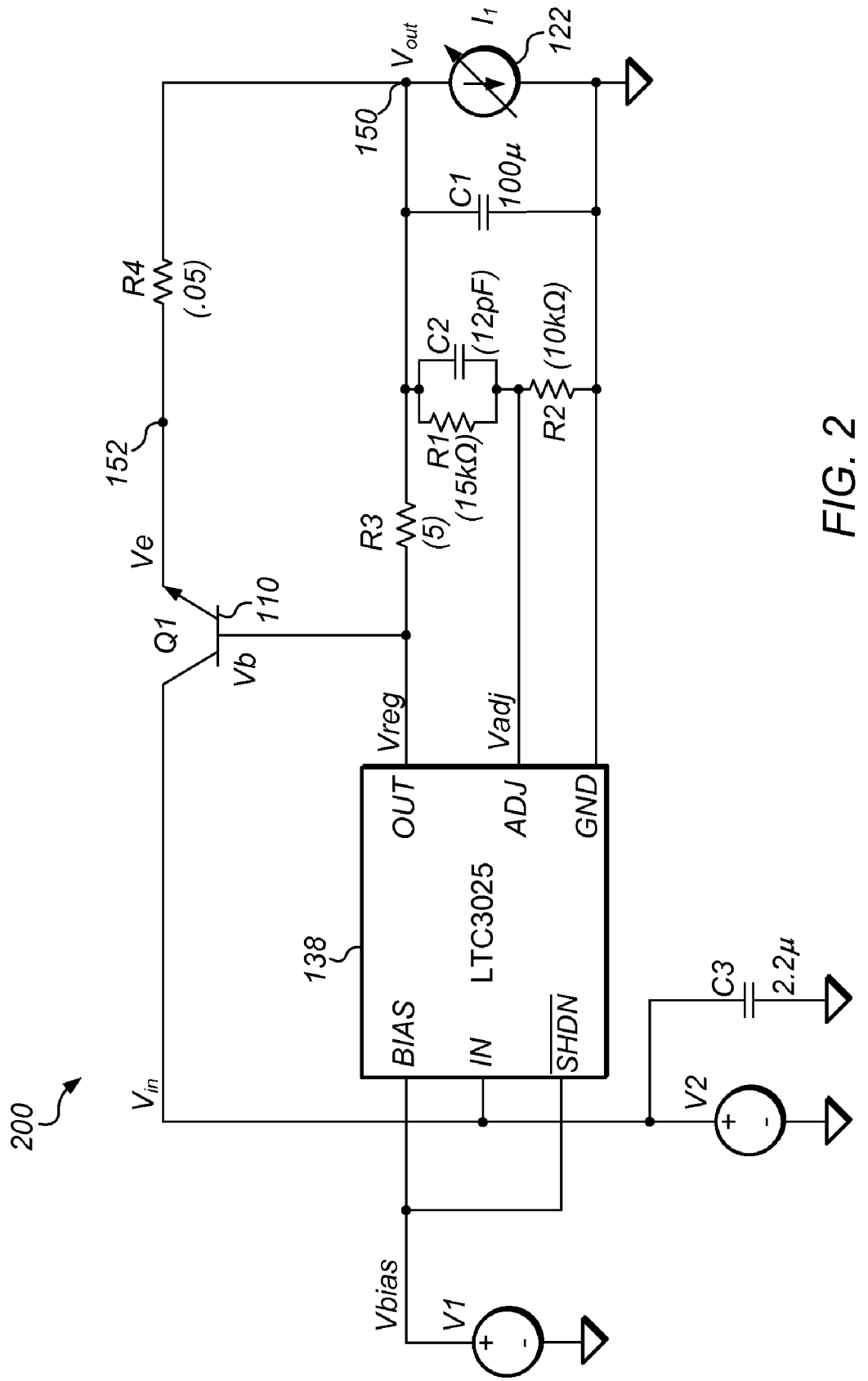
FIG. 2 is a circuit diagram of one embodiment of the current sense circuit of FIG. 1.

Turning now to FIG. 2, current sense circuit 200 may include a low dropout linear voltage regulator 138, for example a Linear Technology LTC3025 voltage regulator. Detailed functionality of voltage regulator 138 and its various terminals/pins may be found in the Linear Technology parts documentation for LTC3025. The BIAS terminal is for providing internal power for circuitry of voltage regulator 138, the GND terminal is for coupling voltage regulator 130 to a voltage reference (e.g. a ground plane), the IN terminal is for providing the input supply voltage, which may serve as the source voltage from which the output load current may be directly derived, the ADJ terminal is the input to the error amplifier of voltage regulator 138, used in regulating the voltage provided at the OUT terminal by adjusting the current sourced at the OUT terminal. The output voltage $V_{out}$ in current sense circuit 200 may be set at node 150 as shown, and the output voltage range may be 0.4V to 3.6V, typically set by connecting the ADJ terminal to a resistor divider from $V_{out}$ to GND, as shown. Thus, a voltage divider with resistors R1 and R2 may be used to set the desired value for $V_{out}$.

Shunt element 130 from FIG. 1 may be implemented as resistor R3 to effectively provide a first current path between the OUT terminal of voltage regulator 138 and the supply terminal of load 122 (at node 150). Similarly, shunt element 132 from FIG. 1 may be implemented as resistor R4 to effectively provide a second current path to the supply terminal of load 122, through transistor 110 implementing switch 134 from FIG. 1. Therefore, when a load 122 is connected between node 150 and ground, a current may flow from voltage regulator 138 through the OUT terminal and through resistor R3 and into the power terminal (at node 150) of load 122, when voltage regulator 138 is powered up. Depending on its power/current requirements, load 122 may require relatively low currents, e.g. in the 200 mA and/or lower range, or larger currents, e.g. currents larger than 200 mA. The size of the currents may vary according to expected loads for which current is to be measured, thus many different embodiments may exist with different actual current values. In other words, in certain applications the current threshold considered to be the upper bound of low/small currents may be somewhat higher than 200 mA or somewhat lower than 200 mA. However, the respective values of R3 and R4, and the relationship between the respective values of R3 and R4 may together determine the level of granularity at which the smaller currents conducted by load 122 may be measured (when R3 is conducting current but R4 is not conducting current), and the overall dynamic range of currents that current sense circuit 200 may be capable of measuring (when both R3 and R4 are conducting currents).

For example, R3 may have a value that is two orders of magnitude higher than the value of R4. In the embodiment shown, R3 may have a value of 5Ω, while R4 may have $100^{th}$ of that value, i.e. 0.05Ω. Transistor 110 may turn on depending on the value of the voltage Vreg at terminal OUT of voltage regulator 138 and the voltage $V_{out}$ at terminal 150. Typically, when load 122 is expected to conduct smaller currents, $V_{out}$ may be set to a lower value using the voltage divider consisting of R1 and R2 (with exemplary values for R1 and R2 indicated in FIG. 2—other embodiments may have different values as required). When the value of the current required by load 122 results in a voltage drop across R3 that is below the required threshold value for transistor 110 to turn on, current will be conducted by R3, but no current will flow in the second current branch, that is, through R4. In this case the total current conducted by load 122 will be the same as the current conducted by R3. This current may be measured by simply measuring the voltage drop across the terminals of R3, and divide that voltage-drop by the value of R3. With R3 having a sufficiently high value (5Ω in the example), even a small change in current may correspond to a noticeable difference in the voltage drop across resistor R3. For example, a 100 mA current would correspond to a 500 mV drop across R3, while an 110 mA current would correspond to a 550 mV drop across R3. Therefore, smaller currents may be measured more accurately, as even a small difference (e.g. 10 mA) between two currents may result in an appreciable voltage drop difference (50 mV) across resistor R3. The current $I_1=V_{R3}/R3$, where $V_{R3}$ represents the voltage drop across resistor R3.

When the value of the current required by load 122 results in a voltage drop across R3 that exceeds the threshold voltage required for transistor 110 to turn on, current will be conducted through R4, and the total current conducted by load 122 will be the sum of the respective currents flowing through R3 and R4. With the value of R3 an order of magnitude (e.g. 10 times) or more higher than the value of R4 (in the example shown, R3 has a value 100 times the value of R4), the incremental current conducted by R4 will be exponentially higher than the incremental current conducted by R3. This enables load 122 to draw large currents in a range that voltage regulator 138 may not be able to source for the same value of R3. Thus, the total current conducted by load 122 may be measured by measuring the respective voltage drops across R3 and R4 to obtain the respective currents flowing through R3 and R4, to obtain the total current $I_1$ according to:

$$I_1 = I_{R3} + I_{R4} = (V_{R3}/R3) + (V_{R4}/R4),$$

where $I_{R3}$ represents the current flowing through R3, $I_{R4}$ represents the current flowing through R4, $V_{R3}$ represents the voltage drop across resistor R3, and $V_{R4}$ represents the voltage drop across resistor R4. Accordingly, there will be a specific current level of $I_{R3}$ associated with the threshold voltage (required for transistor 110 to turn on), and thus transistor 110 will prevent current from flowing through resistor R4 until the current flowing through R3 reaches a specified current threshold corresponding to the value of resistor R3 and the turn-on threshold voltage of transistor 110.

As also previously mentioned, coupling resistor R1 between the ADJ terminal of voltage regulator 138 and measurement node 150 establishes a feedback loop from $V_{out}$ to an error amplifier within voltage regulator 138 to allow for regulation of $V_{out}$. In addition, a capacitor C2 (having a value of 12 pF in the embodiment shown) may be added across the terminals of R1 to readjust the phase margin and thus obtain a better loop response during voltage regulation. A bypass capacitor C1 may also be configured across measurement terminal 150 and the voltage reference (in this case ground), acting as a "non-conducting load" when no actual load 122 is coupled between node 150 and ground. It should also be noted that while the embodiments discussed herein show the transistor receiving a supply voltage from the same source as the voltage regulator, alternate embodiments in which the transistor may be provided a supply voltage from a different source are possible and are contemplated.

Numerous variations and modifications will become apparent to those skilled in the art once the above disclosure is fully appreciated. It is intended that the following claims be interpreted to embrace all such variations and modifications.

I claim:

1. A current sense circuit for measuring current conducted by a device under test (DUT), the current sense circuit comprising:
   a measurement node configured to couple to the DUT;
   a voltage regulator configured to receive an input voltage at an input terminal and provide a controlled current at an output terminal;
   a first current branch established between the output terminal of the voltage regulator and the measurement node;
   a switching device coupled to a supply voltage and the output terminal of the voltage regulator;
   a second current branch established between the switching device and the measurement node;
   wherein the switching device is configured to:
      disable current flow in the second current branch responsive to a current in the first current branch not exceeding a specified value; and
      enable current flow in the second current branch responsive to the current in the first current branch exceeding the specified value.

2. The current sense circuit of claim 1, wherein a total current conducted by the DUT is the sum of the respective currents conducted in the first current branch and the second current branch.

3. The current sense circuit of claim 1, wherein the measurement terminal is configured to couple to a supply terminal of the DUT.

4. The current sense circuit of claim 1, wherein the switching element is a transistor device having a control terminal coupled to the output terminal of the voltage regulator.

5. The current sense circuit of claim 4;
   wherein the first current branch comprises a first shunt resistor coupled between the output terminal of the voltage regulator and the measurement terminal;
   wherein the second current branch comprises a second shunt resistor coupled between a first channel terminal of the transistor device and the measurement terminal; and
   wherein a total current conducted by the DUT is equivalent to the sum of the respective currents conducted by the first shunt resistor and the second shunt resistor.

6. The current sense circuit of claim 5, wherein the value of the first shunt resistor is one or more orders of magnitude higher than the value of the second shunt resistor.

7. A method for sensing current conducted by a device under test (DUT), the method comprising:
   establishing a first current flowing through a first current path into a supply terminal of the DUT;
   responsive to the first current reaching a threshold value, establishing a second current flowing through a second current path into the supply terminal of the DUT; and
   the DUT conducting a total current equivalent to a sum of the currents flowing into the supply terminal of the DUT;
   wherein a maximum value of the second current is at least one order of magnitude higher than a maximum value of the first current.

8. The method of claim 7, further comprising preventing current flow through the second current path responsive to the first current falling below the threshold value.

9. The method of claim 7, wherein establishing the first current flowing through the first current path comprises establishing a regulated voltage at the supply terminal of the DUT.

10. The method of claim 7, wherein establishing the second current flowing through the second current path comprises controlling a switching device.

11. The method of claim 10, wherein controlling the switching device comprises:
    a control voltage at a control terminal of the switching device turning on the switching device to establish the second current flowing through the second current path; and
    the control voltage at the control terminal of the switching device turning off the switching device to prevent current flow through the second current path.

12. The method of claim 11, wherein the control voltage turning on the switching device comprises the control voltage reaching at least a specified voltage threshold value; and
    wherein the control voltage turning off the switching device comprises the control voltage falling below the specified voltage threshold value.

13. The method of claim 11, further comprising adjusting the control voltage responsive to the value of a regulated voltage provided at the power terminal of the DUT.

14. The method of claim 7, further comprising measuring the total current conducted by the DUT, comprising:
    measuring a first voltage drop across a first shunt resistor configured in the first current path; and
    measuring a second voltage drop across a second shunt resistor configured in the second current path.

15. A current sense circuit comprising:
    a measurement terminal configured to couple to a load;
    a first shunt element having a first terminal coupled to the measurement terminal;
    a voltage regulator having an output coupled to a second terminal of the first shunt element, and configured to provide a regulated output voltage at the measurement terminal according to an input voltage, to cause a first current to flow through the first shunt element when a load is coupled to the measurement terminal;
    a second shunt element having a first terminal coupled to the measurement terminal; and
    a switching element having a first terminal configured to receive the input voltage, a second terminal coupled to the output of the voltage regulator, and a third terminal coupled to a second terminal of the second shunt element, wherein the switching element is configured to:
       prevent the second shunt element from conducting current when the first current is below a specified threshold; and
       enable the second shunt element to conduct a second current when the first current reaches the specified threshold;
    wherein the second current is at least one order of magnitude higher than the first current.

16. The current sense circuit of claim 15, further comprising a control loop from the measurement terminal to the voltage regulator, the control loop comprising a voltage control circuit coupled to: the measurement terminal, a feedback terminal of the voltage regulator, and a voltage reference;
    wherein the voltage control circuit is configurable to set the regulated output voltage to a desired value.

17. The current sense circuit of claim 16, wherein the voltage control circuit comprises a voltage divider configured to establish a voltage level at the feedback terminal that is lower than a voltage level established at the measurement terminal.

18. The current sense circuit of claim 16, wherein the voltage control circuit further comprises a capacitive element configured to adjust a phase margin of the control loop.

19. A current sense circuit comprising:
an output terminal configured to couple to a supply terminal of a load;
a voltage regulator configured to provide an adjustable voltage at a first output according to an input voltage;
a first resistive element having a pair of terminals, one of the pair of terminals coupled to the first output, and the other of the pair of terminals coupled to the output terminal;
a second resistive element having a pair of terminals, a first terminal of the pair of terminals coupled to the output terminal;
a transistor device having:
 a first channel terminal configured to receive the input voltage;
 a second channel terminal coupled to the second terminal of the pair of terminals of the second resistive element; and
 a control terminal coupled to the first output; and
a voltage divider coupled between the output terminal and a voltage reference, wherein the voltage divider is configured to set an output voltage developed at the output terminal to a desired nominal value.

20. The current sense circuit of claim 19, wherein the voltage divider comprises:
a third resistive element coupled between the output terminal and a feedback terminal of the voltage regulator; and
a fourth resistive element coupled between the feedback terminal of the voltage regulator and the voltage reference;
wherein the voltage regulator is further configured to adjust the adjustable voltage at the first output according to the input voltage and the voltage developed at the feedback terminal.

21. A method for measuring current conducted by a device having a supply terminal configured to receive a supply voltage, and further having a reference terminal, the method comprising:
establishing a first current flowing through a first shunt element into the supply terminal of the device;
responsive to the first current reaching a threshold value, establishing a second current flowing through a second shunt element into the supply terminal of the device, wherein the value of the first shunt element is at least one order of magnitude higher than the value of the second shunt element;
measuring a first voltage across the first shunt element to obtain the value of the first current; and
measuring a second voltage across the second shunt element to obtain the value of the second current;
wherein a total current conducted by the device is the sum of the first current and the second current.

22. The method of claim 21, further comprising:
responsive to the first current falling below the threshold value, eliminating the second current by preventing current from flowing through the second shunt element; and
subsequent to eliminating the second current, measuring the first voltage across the first shunt element to obtain the value of the first current;
wherein a total current conducted by the device is the first current.

* * * * *